(12) United States Patent
Sloan et al.

(10) Patent No.: US 6,462,945 B2
(45) Date of Patent: Oct. 8, 2002

(54) APPARATUS AND METHOD FOR COOLING A HEAT GENERATING COMPONENT

(75) Inventors: Robert C. Sloan, Georgetown; Mark S. Manley, Leander; Roy A. Rachui, Georgetown; Forrest J. Pobst, Austin, all of TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/760,266

(22) Filed: Jan. 12, 2001

(65) Prior Publication Data

US 2002/0093789 A1 Jul. 18, 2002

(51) Int. Cl.[7] ................................. H05H 7/20
(52) U.S. Cl. ................. 361/687; 361/695; 361/704; 454/353; 165/80.3
(58) Field of Search .................. 361/687, 695, 361/704, 720, 683–686, 724–727; 454/184, 353; 165/80.3

(56) References Cited

U.S. PATENT DOCUMENTS

| 5,331,507 | A | | 7/1994 | Kyung et al. ............ 361/720 |
| 5,424,913 | A | | 6/1995 | Swindler ................. 361/687 |
| 5,546,272 | A | | 8/1996 | Moss et al. .............. 361/687 |
| 5,568,360 | A | | 10/1996 | Penniman et al. ......... 361/687 |
| 5,572,403 | A | | 11/1996 | Mills .................... 361/695 |
| 5,930,115 | A | | 7/1999 | Tracy et al. ............. 361/704 |
| 6,209,623 | B1 | * | 4/2001 | Tantoush ................. 165/80.3 |
| 6,229,703 | B1 | * | 5/2001 | Lee ...................... 361/704 |
| 6,304,453 | B1 | * | 10/2001 | Lo ....................... 361/704 |

* cited by examiner

*Primary Examiner*—Darren Schuberg
*Assistant Examiner*—Hung Van Duong
(74) *Attorney, Agent, or Firm*—Haynes and Boone, LLP

(57) ABSTRACT

An apparatus and method for cooling a heat-generating component according to which a body member is placed over a portion of a heat sink so that flanges on the body member engage the component. The body member is forced away from the heat sink so that the flanges force the component and the heat sink into intimate contact.

17 Claims, 2 Drawing Sheets

US 6,462,945 B2

APPARATUS AND METHOD FOR COOLING A HEAT GENERATING COMPONENT

BACKGROUND

The disclosures herein relate generally to an apparatus and method for cooling a heat generating component in a computer, or other similar electronic device, and, more particularly, to such an apparatus and method according to which a heat sink is forced into in intimate contact with the component.

There are several applications involving electronic devices that have heat generating components which should be cooled. For example, as computers, such as laptop and notebook computers, desktop computers, servers, and the like, grow in speed and capacity, power consumed within each device per unit volume increases dramatically. Because the computer chassis is often crowded with components, especially in connection with laptop and notebook computers, it is important, if not necessary, that the heat generating components, such as processors, etc., be cooled. To this end, heat sinks are often placed adjacent the heat generating components in a heat exchange relation to the component to transfer heat generated by the component to the heat sink, and dissipate the heat for removal from the interior of the device by a fan, or the like.

Various devices have been used to mount a heat sink against a processor within the interior of a computer with a predetermined force to insure intimate contact between the heat sink and processor, and a satisfactory heat transfer. For example, the processor is often placed into a motherboard socket, the heat sink is then oriented over the processor, and one end of a clip is then located, hole over tab, to one end of the socket, and, with a tool, pushed, pulled out, and located over the other tab.

However, this technique is not without disadvantages. For example, it requires extensive handling of the clip, often requiring the use of two hands, and it is difficult to apply the required amount of force at the precise location required. Also, it requires special tools and, once assembled, it often becomes loose and compromises the intimate contact between the heat sink and the processor.

Accordingly, what is needed is a computer, or other similar type of electronic component, in which a heat sink can be attached to a heat generating component in a manner to avoid the above problems.

SUMMARY

To this end, according to one embodiment, a body member is placed over a portion of a heat sink so that flanges on the body member engage the component. The body member is forced away from the heat sink so that the flanges force the component and the heat sink into intimate contact.

Significant advantages are achieved with the above embodiment because the heat sink can be attached to a heat generating component in a manner to avoid the above problems.

DETAILED DESCRIPTION OF THE PREFERRED EMBODIMENT

Figure 1:
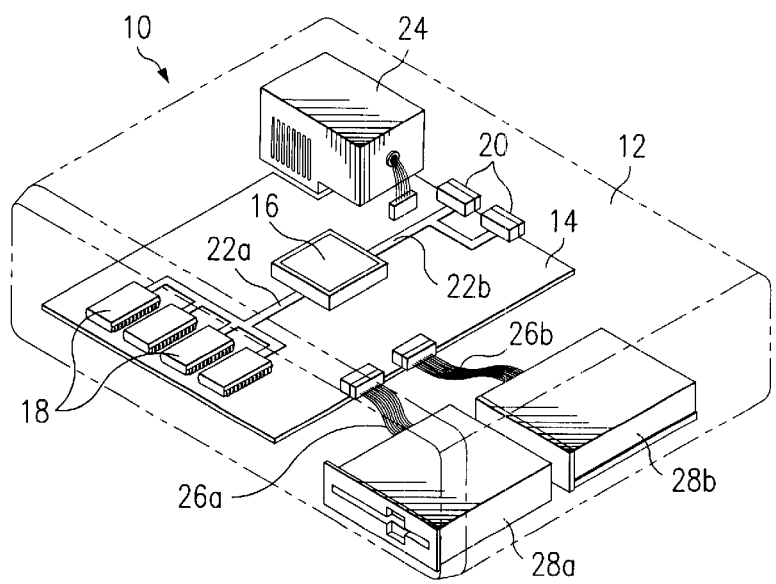
FIG. 1 is a diagrammatic view of a computer system according to an embodiment of the present disclosure.

An embodiment of the present disclosure is shown in FIG. 1 in connection with a portable computer, referred to, in general, by the reference numeral 10. The computer 10 includes a chassis 12 in which a motherboard 14 is mounted. A processor 16 is connected to the motherboard 14, and a plurality of memory devices, or modules, 18 and two input/output (I/O) devices 20 are mounted on the motherboard. Two buses 22a and 22b are also provided on the motherboard 14 and connect the processor 16 to the memory modules 18 and to the input/output devices 20, respectively. The memory modules 18 provide storage to facilitate execution of computer programs by the processor 16.

A power supply 24 is connected to the motherboard 14 and a pair of cable assemblies 26a and 26b connect the motherboard to a hard drive unit 28a and a disk drive unit 28b, respectively. It is understood that other components, electrical traces, electrical circuits and related devices (not shown) are provided in the chassis 12. Because these are all conventional, they will not be described in any further detail.

Figure 2:
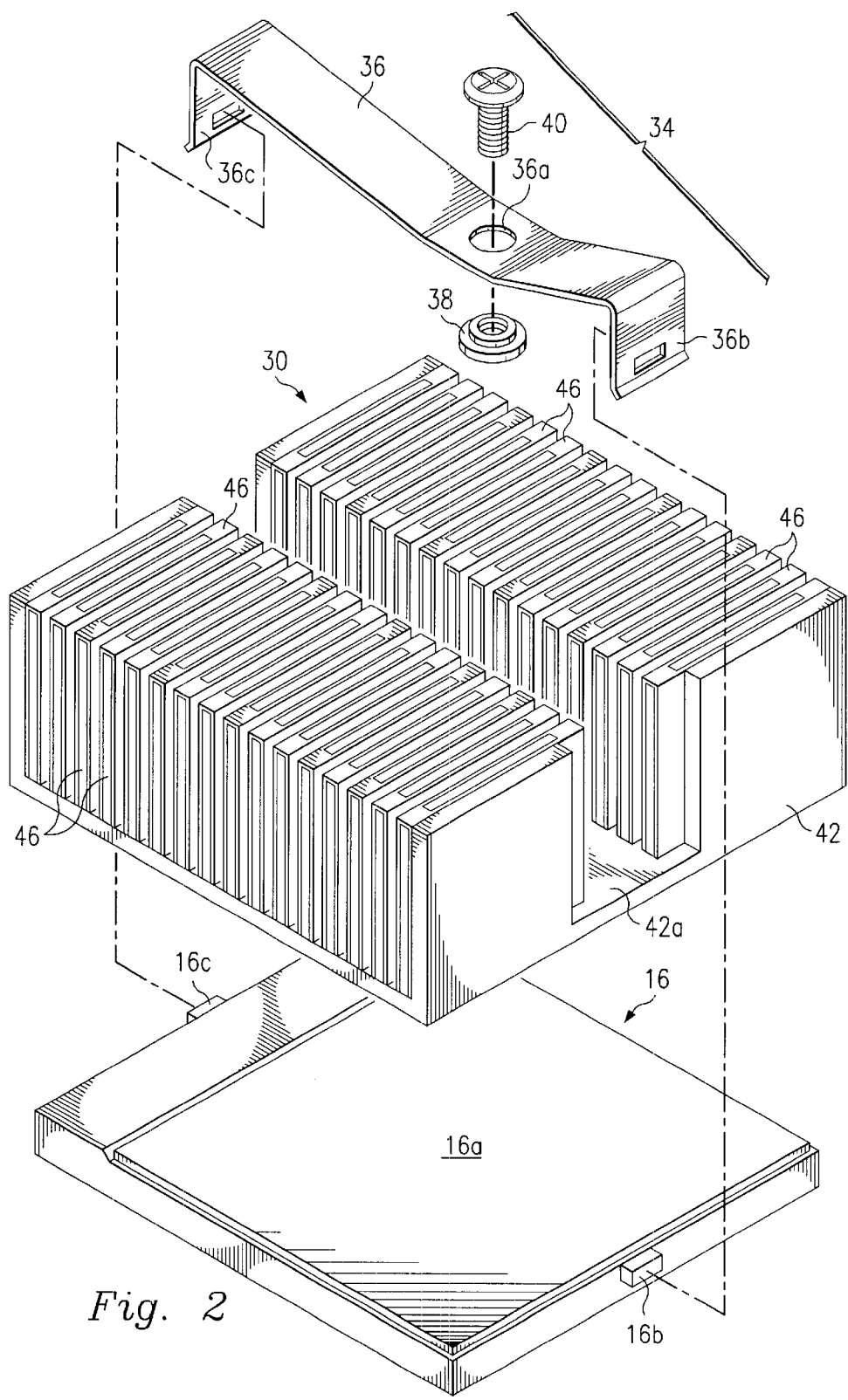
FIG. 2 is an enlarged, exploded, isometric view of clip assembly for attaching a heat sink to the processor of the computer of FIG. 1.

The processor 16 is also shown in FIG. 2, and includes a housing 16a having two mounting tabs 16b and 16c extending from its respective ends. A heat sink 30 is designed to be placed over the processor 16 in intimate contact with the processor in a manner to be described. To this end, a clip assembly 34 is provided which includes a body member 36 having a central opening 36a and two end flanges 36b and 36c which extend substantially perpendicular to the body member. The flanges 36b and 36c are preferably integral with the body member 36, and are formed by bending the respective end portions of the clip. An opening is formed through each of the flanges 36b and 36c, for reasons to be described. A nut 38 is affixed to the bottom of the body member 36 in any conventional manner, in alignment with the opening 36a, and a bolt 40 is provided which extends through the opening and threadedly engages the nut for reasons to be explained.

The heat sink 30 includes a chassis 42 having a bottom plate, or floor 42a, the length and width of which substantially correspond to the length and width of the processor 16. Two rows of slightly-spaced heat sink elements, or fins, 46 are disposed on the floor 42a, and are attached to the chassis in any conventional manner. The space between the two rows of fins 46 exposes a portion of the floor 42a of the chassis 42 which receives the clip assembly 34.

Figure 3:
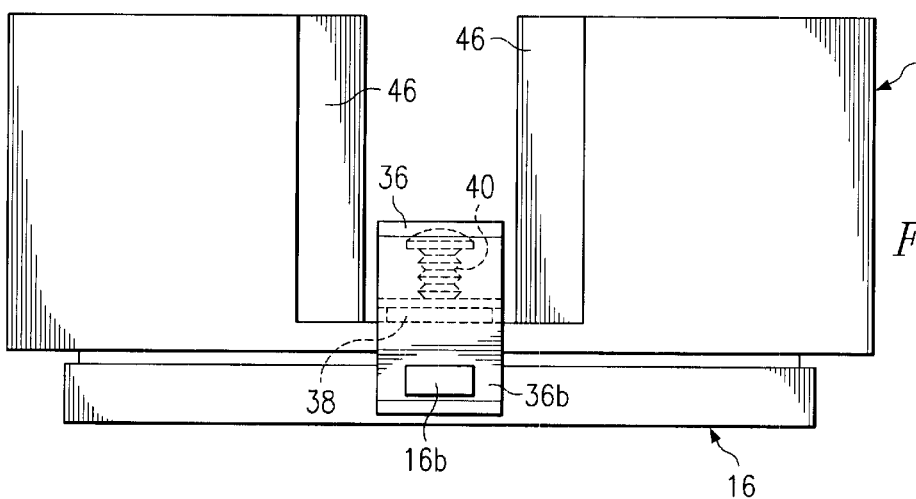
FIG. 3 is a front elevational view of the clip assembly of FIG. 2 extending over the heat sink and attached to the processor.

To assemble the heat sink 30 in intimate contact with the upper surface of the processor 16, the bolt 40 is placed through the opening 36a in the body member 36 and in threaded engagement with the nut 38, and the clip assembly 34 is manually inserted into the space between the rows of fins 46. The assembly 34 is then manually lowered until the respective ends of the flanges 36b and 36c engage the respective upper surfaces of the tabs 16b and 16c of the processor 16. This can be easily done by grasping the body member 36 with one hand, aligning it with the above space in the heat sink 30, and lowering it until the latter ends engage the tabs 16b and 16c. A downwardly directed force is then manually applied on the upper surface of the body member 36, also with one hand, to cause the end flanges 36b and 36c to bend outwardly under spring tension until their respective openings extend over the tabs 16b and 16c. The flanges 36b and 36c thus snap back inwardly with the tabs extending in the latter openings, as shown in FIG. 3 in connection with the tab 16a and the flange 36b. In this position, the lower surface of the nut 38 and the corresponding end of the bolt rest on, or at least, are very close to, the corresponding surface of the floor 42a of the chassis 42.

Figure 4:
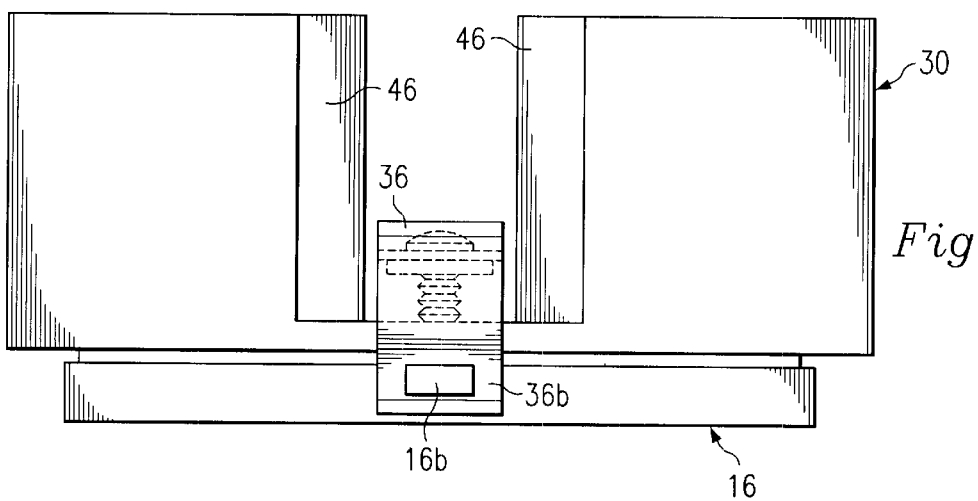
FIG. 4 is a view, similar to FIG. 3 but depicting the clip assembly applying a force between the heat sink and the processor.

A torque is then applied to the head of the bolt 40 which causes the nut 38 to move upwardly relatively to the bolt, as shown in FIG. 4, thus placing a corresponding, upwardly-directed, force on the body member 36 adjacent the opening 36a to force it away from the heat sink. Due to the engagement of the flanges 36b and 36c with the processor tabs 16b and 16c, respectively, this forces the processor 16 and the heat sink 30 into intimate contact, with the amount of force thus applied between the processor 16 and the heat sink 30 being precisely controlled by controlling the amount of torque applied to the bolt 40.

Thus, the body member 36 can be placed in position as described above quickly and easily, utilizing only one hand if desired with minimal handling of the clip.

Also, the amount of force applied by the clip assembly 34, and therefore the amount of force applied between the heat sink 30 and the processor 16, can be controlled in a fairly precise manner by simply rotating the bolt 40. Further, special tools are not required and, once assembled, the clip assembly 34 will maintain the above-mentioned force between the processor 16 and heat sink 30.

It is understood that variations may be made in the foregoing without departing from the scope of the disclosed embodiments. For example, the nut 38 can be eliminated and the opening 36a can be internally threaded for receiving the bolt 40. Further, the system and method of the present disclosure are not limited to a computer but are equally applicable to any electronic device in which a heat sink is used with a heat-generating component. Also, the present disclosure is not limited to placing a heat sink and a processor into contact, but is equally applicable to other components that need to be clamped together. Still further, spatial references, such as "upper", "lower", "over", "under", etc. are for the purpose of illustration only and do not limit the specification orientation or location of the structure described above.

Because other modifications, changes, and substitutions are intended in the foregoing disclosure, it is appropriate that the appended claims be construed broadly and in a manner consistent with the scope of the embodiments.

What is claimed is:

1. A computer comprising:
    a chassis;
    a heat-generating component disposed in the chassis;
    a heat sink disposed in the chassis;
    a clip assembly applying a force between the heat sink and the component, the clip assembly comprising a body member extending over a portion of the heat sink and flanges extending from the respective ends of the body member and engaging the component, and movable members forcing the body member away from the heat sink so that the flanges force the component and the heat sink into intimate contact; and
    a housing and tabs extending from the respective ends of the housing, the flanges respectively engaging the tabs upon the application of a manual force to at least one of the movable members.

2. The computer of claim 1 wherein the movable members include a bolt which threadedly engages a nut and also engages the body member so that the application of torque to the bolt causes the nut to apply the force to the body member.

3. The computer of claim 1 wherein the heat sink comprises:
    a chassis, and at least two spaced rows of fins mounted on the chassis, the clip assembly extending in the space between the two rows of fins, and the bolt engaging the floor of the chassis.

4. The computer of claim 1 further comprising memory and storage disposed in the chassis.

5. The computer of claim 1 wherein the component is a processor.

6. The computer of claim 2 wherein the amount of torque applied to the bolt corresponds to the amount of force between the component and the heat sink.

7. An electronic device comprising:
    a chassis;
    a heat-generating component disposed in the chassis;
    a heat sink disposed in the chassis;
    a clip assembly applying a force between the heat sink and the component, the clip assembly comprising a body member extending over a portion of the heat sink and flanges extending from the respective ends of the body member and engaging the component, and movable members forcing the body member away from the heat sink so that the flanges force the component and the heat sink into intimate contact; and
    a housing and tabs extending from the respective ends of the housing, the flanges respectively engaging the tabs upon the application of a manual force to at least one of the movable members.

8. The device of claim 7 wherein the movable members include a bolt which threadedly engages a nut and also engages the body member so that the application of torque to the bolt causes the nut to apply the force to the body member.

9. The device of claim 7 wherein the heat sink comprises:
    a chassis, and at least two spaced rows of fins mounted on the chassis, the clip assembly extending in the space between the two rows of fins, and the bolt engaging the floor of the chassis.

10. The device of claim 8 wherein the amount of torque applied to the bolt corresponds to the amount of force between the component and the heat sink.

11. A clip assembly applying a force between a heat sink and a heat generating component, the clip assembly comprising:
    a body member extending over a portion of the heat sink, and flanges extending from the respective ends of the body member and engaging the component;
    a plurality of movable members forcing the body member away from the heat sink so that the flanges force the component and the heat sink into intimate contact; and
    a housing having tabs extending from the respective ends of the housing, the flanges respectively engaging the tabs upon the application of a manual force to at least one of the movable members.

12. The assembly of claim 11 wherein the movable members include a bolt which threadedly engages a nut and also engages the body member so that the application of torque to the bolt causes the nut to apply the force to the body member.

13. The assembly of claim 11 wherein the heat sink has at least two spaced rows of fins mounted on the chassis, the clip assembly extending in the space between the two rows of fins, and the bolt engaging the floor of the chassis.

14. The assembly of claim 12 wherein the amount of torque applied to the bolt corresponds to the amount of force between the component and the heat sink.

15. A method of applying a force between a heat sink and a heat generating component, the method comprising:

placing a body member over a portion of the heat sink;

engaging flanges extending from the respective ends of the body member with the component;

manually forcing a first movable member in the direction of the housing so that the flanges respectively engage tabs extending from the respective ends of the component; and in response, moving a second movable member for forcing the body member away from the heat sink so that the flanges force the component and the heat sink into intimate contact.

16. The method of claim 15 wherein the forcing comprises:

threadedly engaging a bolt with a nut;

engaging the bolt with the heat sink; and applying torque to the bolt to cause the nut to apply a force to the body member.

17. The method of claim 16 wherein the amount of torque applied to the bolt corresponds to the amount of force between the component and the heat sink.

* * * * *